United States Patent
Horch

(10) Patent No.: US 10,446,562 B1
(45) Date of Patent: Oct. 15, 2019

(54) ONE-TIME PROGRAMMABLE BITCELL WITH PARTIALLY NATIVE SELECT DEVICE

(71) Applicant: Synopsys, Inc., Mountain View, CA (US)

(72) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/853,426

(22) Filed: Dec. 22, 2017

Related U.S. Application Data

(60) Provisional application No. 62/444,715, filed on Jan. 10, 2017.

(51) Int. Cl.

| | | |
|---|---|---|
| *H01L 27/112* | (2006.01) | |
| *H01L 27/11558* | (2017.01) | |
| *G11C 7/12* | (2006.01) | |
| *G11C 16/24* | (2006.01) | |
| *H01L 23/528* | (2006.01) | |
| *H01L 29/08* | (2006.01) | |
| *H01L 29/423* | (2006.01) | |

(52) U.S. Cl.
CPC ......... *H01L 27/11206* (2013.01); *G11C 7/12* (2013.01); *G11C 16/24* (2013.01); *H01L 23/528* (2013.01); *H01L 27/11558* (2013.01); *H01L 29/0847* (2013.01); *H01L 29/42324* (2013.01)

(58) Field of Classification Search
CPC ....... H01L 27/11206; H01L 2924/1453; H01L 23/525–5258; G11C 17/14–165
See application file for complete search history.

(56) References Cited

U.S. PATENT DOCUMENTS

| | | | |
|---|---|---|---|
| 6,294,809 B1 * | 9/2001 | Logie | H01L 27/115 |
| | | | 257/320 |
| 6,630,724 B1 | 10/2003 | Marr | |
| 7,504,683 B2 | 3/2009 | Candelier et al. | |
| 7,638,855 B2 | 12/2009 | Lung | |

(Continued)

OTHER PUBLICATIONS

"Kilopass Embedded XPM Technology: A new Field Programmable Non-Volatile Memory," Kilopass Corporation, Jan. 29, 2009, 9 pages.

(Continued)

*Primary Examiner* — Walter H Swanson
(74) *Attorney, Agent, or Firm* — Fenwick & West LLP

(57) ABSTRACT

An OTP memory device includes a first and a second doped region of the same polarity in a semiconductor substrate. The second doped region has a higher doping concentration than the first doped region. A drain region and a source region of an opposite polarity are also in the semiconductor substrate. The drain region is positioned over the first, higher doped region, and the drain is positioned over the second, lower doped region. The select device above the semiconductor substrate can form a channel in a channel region of the semiconductor substrate between the source region and the drain region. One portion of the select device is positioned over the first, lower doped region, and another portion of the select device is positioned over the second, higher doped region. An anti-fuse device is positioned above the second doped region and in part above a portion of the source region.

12 Claims, 5 Drawing Sheets

(56) References Cited

U.S. PATENT DOCUMENTS

| | | |
|---|---|---|
| 7,755,162 B2 | 7/2010 | Kurjanowicz et al. |
| 7,961,490 B2 | 6/2011 | Nevers et al. |
| 8,547,763 B2 | 10/2013 | Son et al. |
| 8,644,049 B2 | 2/2014 | Chung |
| 8,724,363 B2 | 5/2014 | Lu et al. |
| 8,848,423 B2 | 9/2014 | Chung |
| 8,933,492 B2 | 1/2015 | Kurjanowicz |
| 9,007,805 B2 | 4/2015 | Lu et al. |
| 9,224,496 B2 | 12/2015 | Chung |
| 9,613,714 B1* | 4/2017 | Wong .................. G06F 12/1408 |
| 2004/0156234 A1 | 8/2004 | Peng et al. |
| 2006/0203591 A1 | 9/2006 | Lee |
| 2007/0183181 A1 | 8/2007 | Peng et al. |
| 2009/0052220 A1 | 2/2009 | Kleveland |
| 2012/0047322 A1 | 2/2012 | Chung |
| 2012/0211841 A1 | 8/2012 | Kurjanowicz |
| 2014/0035014 A1 | 2/2014 | Jeon |
| 2014/0098591 A1* | 4/2014 | Chen ...................... G11C 17/18 365/96 |
| 2015/0078062 A1 | 3/2015 | Lu et al. |
| 2015/0287730 A1* | 10/2015 | Wu et al. ................. G11C 5/06 365/96 |
| 2015/0348631 A1* | 12/2015 | Matsumoto ....... H01L 27/11206 365/185.11 |
| 2016/0049190 A1 | 2/2016 | Han et al. |
| 2016/0293612 A1 | 10/2016 | Park |
| 2017/0076765 A1* | 3/2017 | Huang ................. H03K 17/161 |

OTHER PUBLICATIONS

Kurjanowicz, W., "Evaluating Embedded Non-Volatile Memory for 65nm and Beyond," DesignCon 2008, Sidense Corp., 2008, 23 pages.

Kurjanowicz, W., "Evaluating Embedded Non-Volatile Memory for 65nm and Beyond," DesignCon 2008, International Engineering Consortium, DesignCon 2008, Feb. 4-7, 2008, pp. 176-188.

* cited by examiner

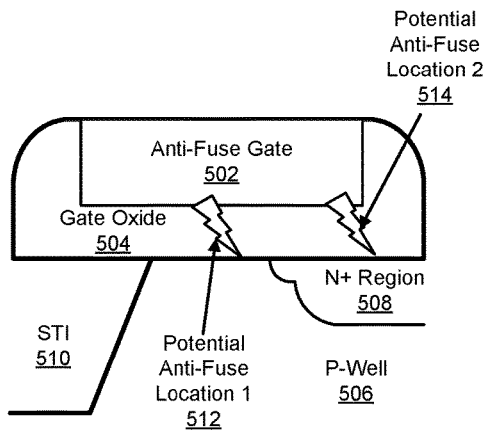

FIG. 5

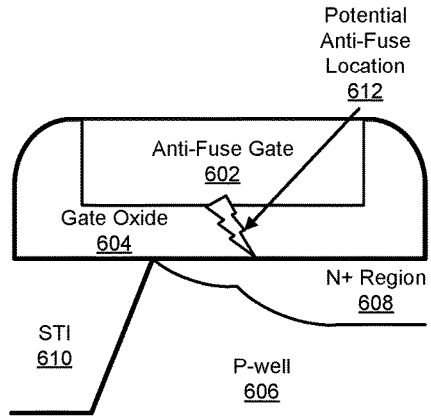

|  | Bitline | Select Gate | Anti-Fuse Gate |
|---|---|---|---|
| Read Select Row | 0 | $V_{DD\_IO}$ | $V_{DD}$ |
| Read Unselected Row | 0 | 0 | 0 |
| Program Selected Row – Rupture (1) | 0 | $V_{inhibit} + V_{T:N}$ | $V_{rupture}$ |
| Program Selected Row – Inhibit (0) | $V_{inhibit}$ | $V_{inhibit} + V_{T:N}$ | $V_{rupture}$ |
| Program Unselected Row | 0 or $V_{inhibit}$ | 0 | 0 |
| Idle | 0 | 0 | 0 |

750

|  | Bitline | Select Gate | Anti-Fuse Gate |
|---|---|---|---|
| Read Select Row | 0 | 2.5 | 1.2 |
| Read Unselected Row | 0 | 0 | 0 |
| Program Selected Row – Rupture (1) | 0 | 3.4 | 8.7 |
| Program Selected Row – Inhibit (0) | 2.9 | 3.4 | 8.7 |
| Program Unselected Row | 0 or 2.9 | 0 | 0 |
| Idle | 0 | 0 | 0 |

FIG. 7

ONE-TIME PROGRAMMABLE BITCELL WITH PARTIALLY NATIVE SELECT DEVICE

CROSS REFERENCE TO RELATED APPLICATION

This application claims the benefit of U.S. Provisional Application No. 62/444,715, entitled "ONE-TIME PROGRAMMABLE (OTP) BITCELL SELECT DEVICE INCLUDING NATIVE SUBSTRATE AS PART OF CHANNEL," filed Jan. 10, 2017, which is incorporated by reference herein in its entirety.

BACKGROUND

This disclosure relates to one-time programmable bitcell, and more specifically to a one-time programmable bitcell with reduced leakage at its select device.

The Internet of Things (IoT) is an emerging market in the semiconductor industry.

The IoT is a network of internetworked smart devices. The category of IoT smart devices includes any devices that are networked together and are not traditional computers. Examples of smart devices include home automation (thermostats, security, lighting, home appliances, etc.), biochip transponders on animals, Radio-frequency identification (RFID) chips for inventory control, and many other types of devices. Many of these devices require non-volatile memory (NVM). Many IoT devices have limited power supplies such as small batteries; as another example, RFID chips typically extract power from the radio waves sent by the RFID reader. This creates a need for a very low power NVM embedded memory. The NVM can be used to store code (e.g., firmware) in IoT chips, record history from a sensor (e.g., an RFID chip that records temperature during the transport of some item), store the history of an animal with a biochip transponder, and for many other applications.

One-Time Programmable (OTP) Gate Oxide rupture memories can be used as NVM on IoT devices. OTP Gate Oxide memories typically include an anti-fuse device having a thin oxide layer and a select device having a thicker oxide layer. The anti-fuse and select devices are connected in series. OTP Gate Oxide memories typically use an electric field of around 30 MV/cm to rupture anti-fuses in the thin oxide of the anti-fuse devices. This 30 MV/cm is a compromise voltage that balances the demands of programming speeds and stresses on the chip. Many applications program the OTP memory at test, and testing time is a significant portion of the total manufacturing cost of a chip. Using higher voltages reduces the programming time, thus reducing test costs and overall manufacturing cost. Typically, 30 MV/cm provides a reasonable programming time and tolerable amount of stress on the peripheral devices.

When a selected bitcell is being programmed, an inhibit voltage can be applied to the drain of all bitcells connected to the same select device and anti-fuse device as the bitcell being programmed. This inhibit voltage prevents the connected bitcells from accidentally rupturing during programming of the bitcell selected for programming. In a typical 55 nm 1.2V/2.5V process, 30 MV/cm on the 1.2V device is around an 8.7V rupture voltage, and the inhibit voltage may be around 2.9V, or one-third of the rupture voltage. The inhibit voltage is supplied by a bitline, which connects bitcells running along a direction perpendicular to the direction of the select device and anti-fuse device. The unselected bitcells connected to an inhibited bitcell via the bitline are being neither programmed nor inhibited, and their NMOS select devices and anti-fuse devices are grounded. The 2.9V supplied to the drain of these otherwise grounded bitcells is higher than the specified power supply voltage of 2.5V. Applying a 2.9V bitline voltage to the drain of a select device with a grounded gate can lead to gate induced drain leakage (GIDL). GIDL is a leakage current that occurs due to a high electric field between the gate and the drain. Since a NVM device can have many bitcells connected to each select device and anti-fuse device, and many bitcells along each bitline, the number of bitcells that receive the inhibit voltage at a grounded select gate, and thus exhibit GIDL, can be quite high, creating a lot of leakage within the NVM device.

Applying a lower inhibit voltage (e.g., 2.5V) to the bitline will reduce the GIDL, but this lower voltage will increase the stress on the bitcells being inhibited. This can lead to unwanted programming events or latent gate oxide damage in the inhibited bitcells, which is problematic for high-reliability products. Latent gate oxide damage causes an oxide to rupture later with low stress. Low stress can be the stress the oxide seeing during a normal read operation. Other previous solutions to address GIDL include supplying a high current to the unselected devices, breaking up an array of bitcells to reduce the number of devices producing GIDL, and placing two select devices in series to create a gate cascode. However, running a high current consumes power, which is undesirable for lower power IoT applications. Breaking up an array of bitcells and using a gate cascode both increase the size of the NVM, which is also undesirable.

SUMMARY

Embodiments relate to a one-time programmable (OTP) memory device in which the drain of the select device is formed in a low doped region, and a portion of the select device is placed above the low doped region. Placing the drain in the low doped region and the select device partially above the low doped region reduces the gate-induced drain leakage (GIDL) on the select device without requiring a high current supply or significantly increasing the size of the device.

In some embodiments, the OTP memory device includes a first and a second doped region of the same polarity in a semiconductor substrate. The second doped region has a higher doping concentration than the first doped region. A drain region and a source region of an opposite polarity are also in the semiconductor substrate. The source region is positioned over the first, higher doped region, and the drain is positioned over the second, lower doped region. The select device above the semiconductor substrate can form a channel in a channel region of the semiconductor substrate between the source region and the drain region. One portion of the select device is positioned over the first, lower doped region, and another portion of the select device is positioned over the second, higher doped region. An anti-fuse device is positioned above the second doped region and in part above a portion of the source region.

BRIEF DESCRIPTION OF DRAWINGS

FIG. 5 is a cross sectional diagram of an anti-fuse device with two potential anti-fuse locations, according to one embodiment.

FIG. 6 is a cross sectional diagram of an anti-fuse device in which the source region extends further into the anti-fuse device, according to one embodiment.

FIG. 7 shows two tables of operation voltages of an OTP memory device according to one embodiment.

DETAILED DESCRIPTION

Figure 1:
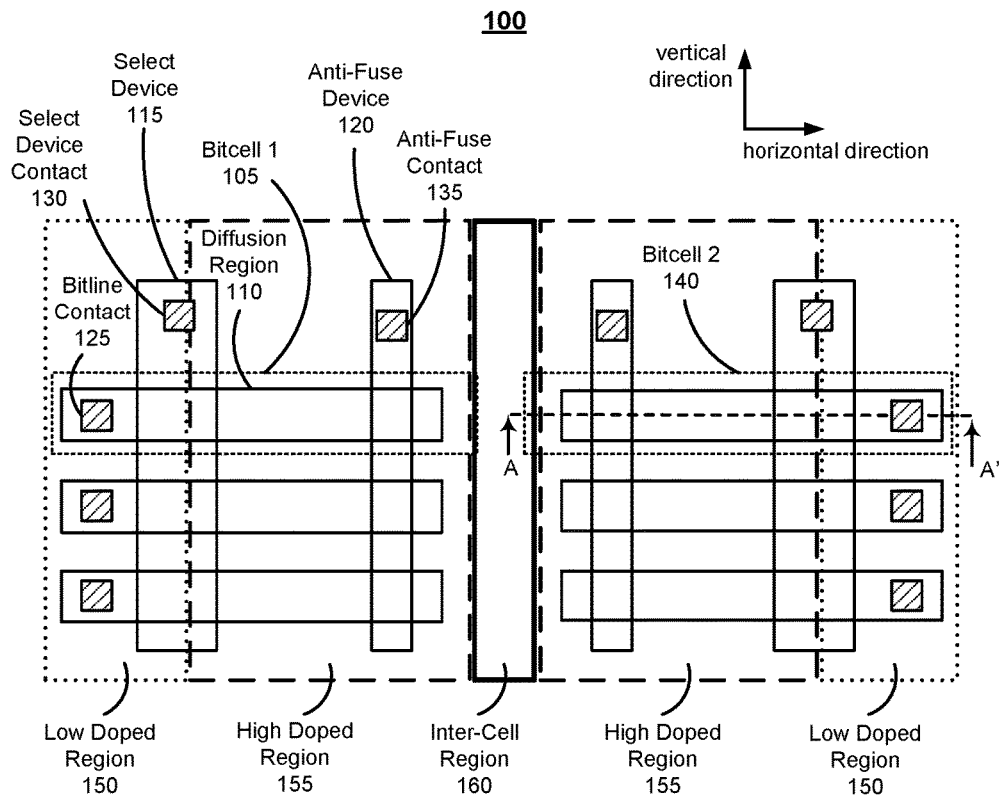
FIG. 1 illustrates a top view of an OTP memory device, according to one embodiment.

Embodiments relate to a one-time programmable (OTP) memory device that has a low doping concentration under the drain of a select device. In the OTP memory device, bitcells are connected to other bitcells in two directions, e.g., horizontal and vertical. For example, bitcells can be vertically connected via select devices and anti-fuse devices and horizontally connected via Bitlines. It is common to refer to the select and fuse devices sharing a common gate connection as being rows, running vertically in the embodiments described below. The Bitlines, which run perpendicular to the rows and connect the drains of the select devices, are commonly referred to as columns. Columns run horizontally in the embodiments described below. When an individual selected bitcell is being programmed, a high rupture voltage is applied to the anti-fuse device gate of the row containing the bitcell. At the same time, the substrate region below the gate of the anti-fuse being ruptured is held at ground by both turning the select device on and holding the drain of the select device at ground. To prevent another other fuse from being ruptured, an inhibit voltage is applied to the drains of the vertically connected bitcells. This inhibit voltage prevents the vertically connected bitcells (referred to as "inhibited bitcells") from accidentally rupturing during programming of the selected bitcell. The inhibit voltage is also applied to the drains of the bitcells horizontally connected (via Bitlines) to the inhibited bitcells. The anti-fuse devices and select devices of these unselected or "off" bitcells are grounded. A high inhibit voltage at the drains of the otherwise-grounded off bitcells creates high off-state leakage, referred to as gate induced drain leakage (GIDL). GIDL results from tunneling leakage across a p-n junction formed between the drain and a surrounding opposite-doped region, e.g., a p-well. An electric field from a gate over the diode can enhanced the leakage current. GIDL is particularly problematic in processes in which the power supply for the anti-fuse device is less than three times the power supply voltage for the supply device, e.g., 1.2V/2.5V, 1V/2.5V, or 0.8V/1.8V processes. The devices disclosed herein reduce GIDL by using a low doping concentration under the drain of the select devices, which reduces tunneling leakage across the p-n junction. In a typical CMOS process, the p-well has a concentration on the order of $10^{17}$ dopant ions/cm$^3$, while a substrate with native p-doping (referred to as "native" or "p-sub") has a dopant concentration on the order of $10^{15}$ dopant ions/cm$^3$. Placing the drain region in a low-doped semiconductor (e.g., a p-sub region) rather than a heavily doped well (e.g., a p-well) reduces the doping concentration on the p-n junction, which reduces GIDL at the select device.

The bitcell may be created using a standard complementary metal-oxide-semiconductor manufacturing processes ("CMOS processes"). "OTP bitcell," "bitcell" or "bit" described herein refers to CMOS type (i.e., transistor based) nonvolatile memory. A CMOS OTP bitcell is distinguished from other types of NVM memory such as magnetic memory, such as is found in floppy disks, or optical memory such as is found in CDs or DVDs. OTP bitcells are produced using a CMOS process that includes a number of process steps in a fabrication facility ("fab").

OTP Memory Device with Low Doped Region

FIG. 1 illustrates a top view of an OTP memory device 100, according to one embodiment. The memory device 100 includes multiple bitcells, such as bitcell 1 105 and bitcell 2 140. Bitcell 1 105 bitcell includes a diffusion region 110, a select device 115, an anti-fuse device 120, and a bitline contact 125. The select device 115 is connected to a select device contact 130, and the anti-fuse device 120 is connected to an anti-fuse contact 135. The memory device 100 has a low doped region 150, a high doped region 155, and an inter-cell region 160. The components of each bitcell are embedded into or placed on top of the low doped region 150 and/or high doped region 155. Each bitcell, such as bitcell 2 140 and the other unlabeled bitcells in the memory device 100, includes the same components 110 through 125. While the memory device 100 is shown having six bitcells, the memory device 100 may have many more bitcells than are shown in FIG. 1, and the bitcells may be arranged differently than shown in FIG. 1.

The diffusion region 110 extends across the bitcell 105. A source and a drain are implanted into the diffusion region 110; the source and drain are shown in and described with respect to FIG. 2. The bitcell 105 has two devices, a select device 115 and an anti-fuse device 120. The select device 115 includes a conductive gate and a thick gate oxide that is below the conductive gate, as described below in detail with reference to FIG. 2. The select device 115 is configured to form a channel in a channel region of the diffusion region 110 between the source and the drain. The anti-fuse device 120 includes a conductive gate and a thin gate oxide below the conductive gate.

A bitline contact 125 connects through the thick gate oxide on the side of the select device 115 to apply a voltage to a drain region formed in the diffusion region 110. A select device contact 130 connects to the conductive gate of the select device 115 to apply a voltage to the select device 115. An anti-fuse contact 135 connects to the conductive gate of the anti-fuse device 120 to apply a voltage to the anti-fuse device 120.

As shown in FIG. 1, the select device 115 and anti-fuse device 120 extend across and connect to the diffusion regions of additional bitcells. In the example shown in FIG. 1, the select device 115 and anti-fuse device 120 extend in a vertical direction across three bitcells; in other embodiments, the select device 115 and anti-fuse device 120 may connect to many more bitcells. The select device contact 130 connects to the select device 115 at one end of the select device 115; the select device contact 130 applies a single voltage to the full conductive gate of the select device 115, and thus applies the same voltage to all of the bitcells across which the select device 115 extends. Similarly, the anti-fuse contact 135 connects to the anti-fuse device 120 at one end of the anti-fuse device 120, and applies the same voltage to the full conductive gate of the anti-fuse device 120, including all of the bitcells across which the anti-fuse device 120 extends. In some embodiments, the select device 115 and/or anti-fuse device 120 include additional contacts (not shown), which may be located at different positions across the select device 115 or anti-fuse device 120 and apply the same voltage as select device contact 130 and anti-fuse contact 135, respectively.

The bitline contact 125 is also connected to additional bitcells via a bitline (not shown in FIG. 1). For example, a bitline may connect bitcells in the horizontal direction, so that the bitline connecting to bitline contact 125 also connects to bitcell 2 140. Thus, when an inhibit voltage is applied to the drain region of bitcell 1 105 via the bitline contact 125, the same inhibit voltage will be applied to the drain region of bitcell 2 140.

A low doped region 150, such as a p-sub region, is formed under the bitline contacts 125 and a portion of the select device 115. The low doped region 150 may have the native doping of the substrate (P-sub), or the low doped region 150 may be a P-epi (epitaxial) layer or a p-well with a lower doping concentration than the high doped region 155. If the substrate has no doping or very light doping, the low doped region 150 may be doped to a p-sub doping level (on the order of $10^{15}$ dopant ions/cm$^3$). A high doped region 155, such as a p-well, is under the remainder of the bitcell 105, including a portion of the select device 115, the anti-fuse device 120, and the portion of the diffusion region 110 between the select device 115 and the anti-fuse device 120. The high doped region 155 may have a doping concentration on the order of $10^{17}$ dopant ions/cm$^3$. The high doped region 155 may have at least twice the doping concentration of the low doped region 150. In some embodiments, the doping concentration of the high doped region 155 is on the order of one hundred times the doping concentration of the low doped region 150. An inter-cell region 160 may separate the regions between columns of bitcells. For example, the inter-cell region 160 may be a shallow trench isolation (STI).

Figure 2:
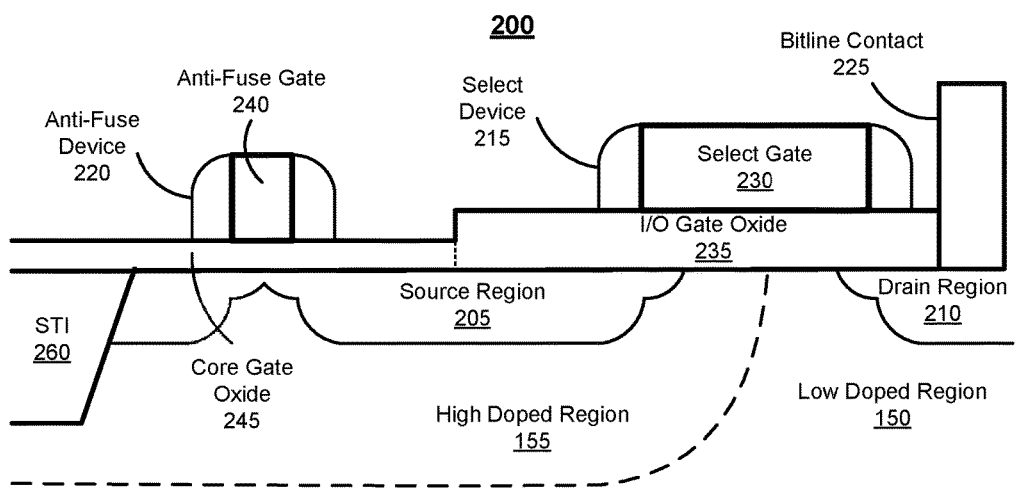
FIG. 2 is a cross sectional diagram an OTP bitcell taken along line A-A' of FIG. 1, according to one embodiment.

FIG. 2 is a cross sectional diagram an OTP bitcell 200 taken along line A-A' of FIG. 1, according to one embodiment. The OTP bitcell 200 corresponds to the bitcell 2 140 in FIG. 1. The bitcell 200 shows many of the same components as bitcell 1 105 in FIG. 1 and is formed on partially on top of the low doped region 150 and partially on top of the high doped region 155. The bitcell 200 includes a source region 205, a drain region 210, a select device 215, an anti-fuse device 220, a bitline contact 225, and an STI 260. The select device 215 includes a select gate 230 and an I/O gate oxide 235 underneath the select gate 230. The anti-fuse device 220 includes an anti-fuse gate 240 and a core gate oxide 245 underneath the anti-fuse gate 240.

The source region 205 and drain region 210 have an opposite doping from the high doped region 155 and low doped region 150. For example, if the high-doped region 155 is a p-well and the low doped region 150 is p-sub, the source and drain regions 205 and 210 are n-doped, e.g., n-LDDs (light doped drains). The source region 205 is formed between the anti-fuse device 220 and the select device 215. The source region 205, select device 215, drain region 210, and bitline contact 225 form a first transistor in which a channel region can form between the source region 205 and the drain region 210. The channel region includes a portion of the low doped region 150 and a portion of the high doped region 155. The anti-fuse device 220 is used to program the bitcell 200. As shown in FIG. 2, the source region 205 extends underneath the anti-fuse device 220 to the STI 260. In particular, the source region 205 has two connected portions, one portion between the anti-fuse device 220 and the select device 215, and a second portion between the anti-fuse device 220 and the STI 260. These two portions are connected underneath the anti-fuse device 220 to form a single source region 205, which acts as a drain to the anti-fuse device 220. In other embodiments, the portions do not connect underneath the anti-fuse device 220, so that there are two distinct n-type regions formed within the high-doped region 155. In such embodiments, the n-type region between the anti-fuse device 220 and the select device 215 acts as a drain of the anti-fuse device 220, while the n-type region near the STI 260 acts as a source of the anti-fuse device 220.

The core gate oxide 245 extends under the anti-fuse device 220, and a thicker I/O gate oxide 235 extends under the select device 215. In some embodiments, the I/O gate oxide 235 is about twice as thick as the core gate oxide 245. During programming of the bitcell 200, an anti-fuse contact, similar to the anti-fuse contact 135 shown in FIG. 1, applies a high voltage, referred to as a rupture voltage, to the anti-fuse gate 240, while the source region 205 and drain region 210 are grounded. This high voltage difference between the anti-fuse gate 240 and the source region 205 ruptures a portion of the core gate oxide 245, creating a short or an "anti-fuse" (not shown in FIG. 2) that allows current to flow though the core gate oxide 245 during reading of the bitcell 200. The rupture voltage is significantly higher than a power supply voltage ("VDD_IO") for the select device, e.g., at least three times the power supply voltage of the select device. For example, in a 1.2V/2.5V process, the rupture voltage may be 8.7V, which is greater than three times 2.5V (7.5V).

As shown in FIG. 2, the source region 205 is fully within the high doped region 155, and the anti-fuse device 220 and a portion of the select device 215 are atop the high doped region 155. The low doped region 150 extends under the drain region 210, the bitline contact 225, and a portion of the select device 215. The doping concentration may be graduated near the boundary between the low doped region 150 and the high doped region 155; there may be some fading between the two regions 150 and 155.

As discussed above, the lower doping concentration in the low doped region 150 around the drain region 210 reduces the dopant concentration on the p side of the p-n junction between the low-doped region 150 and the drain region 210. When the bitcell 200 is in an off state, with the select gate 230 grounded and an inhibit voltage applied to the bitline contact 225, the reduced dopant concentration increases the depletion region's width, which in turn reduces the electric field; that, in turn, reduces the tunneling across the depletion region. The low doping concentration in the low doped region 150 thus reduces the amount of GIDL at the bitcell 200 when another bitcell (that is not connected to the bitcell 200) is being programmed, and a bitcell connected to the same bitline as bitcell 200 (e.g., bitcell 105 in FIG. 1) is being inhibited.

OTP Memory Device with Low Doped Region and Merged Select and Anti-Fuse Device

Figure 3:
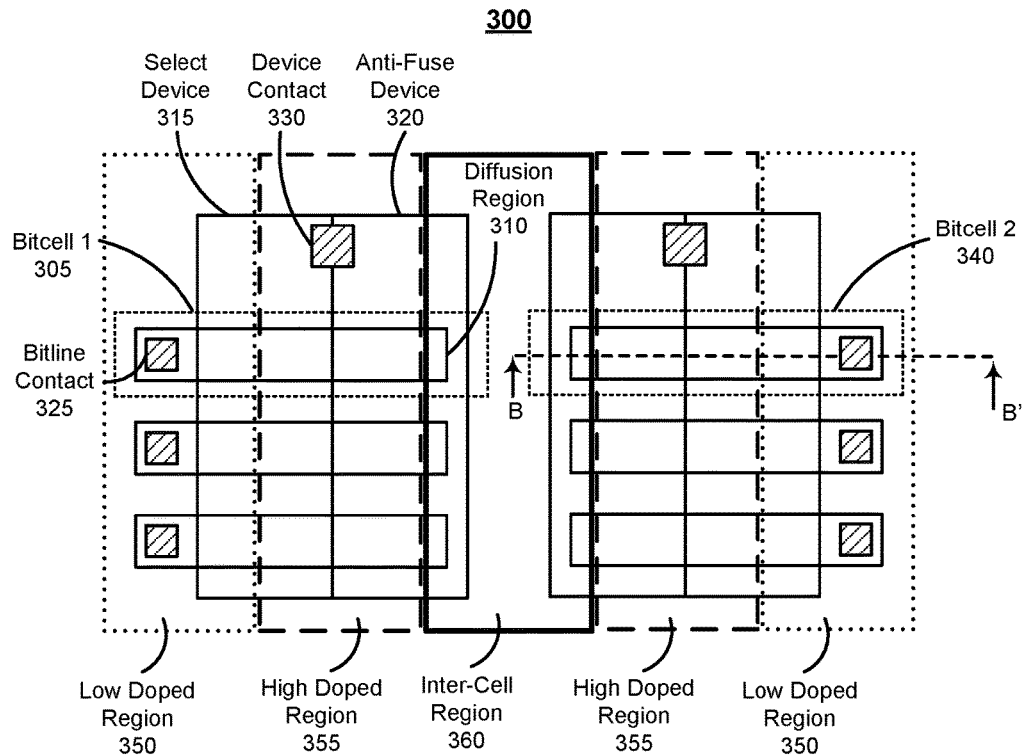
FIG. 3 is a top view of an OTP memory device with a merged select device and anti-fuse device, according to one embodiment.

FIG. 3 is a top view of an OTP memory device 300 with a merged select device and anti-fuse device, according to one embodiment. The memory device 300 includes multiple bitcells, such as bitcell 1 305 and bitcell 2 340. Bitcell 1 305 bitcell includes a diffusion region 310, a select device 315, an anti-fuse device 320, and a bitline contact 325. Bitcell 340 includes the same components. As shown in FIG. 3, the select device 315 and anti-fuse device 320 are in contact with each other, and they are merged into a single device.

Because they are merged, a single voltage is applied to the gates of the select device 315 and anti-fuse device 320. As shown in FIG. 3, a single device contact 330 applies a voltage to the gates of the select device 315 and anti-fuse device 320. In other embodiments, multiple contacts connect to the anti-fuse device 320 and/or select device 315 (e.g., for redundancy), with the same voltage applied to each of the multiple contacts. The bitline contact 325 connects through a thick gate oxide on the side of the select device 315 to apply a voltage to a drain region formed in the diffusion region 310.

Figure 4:
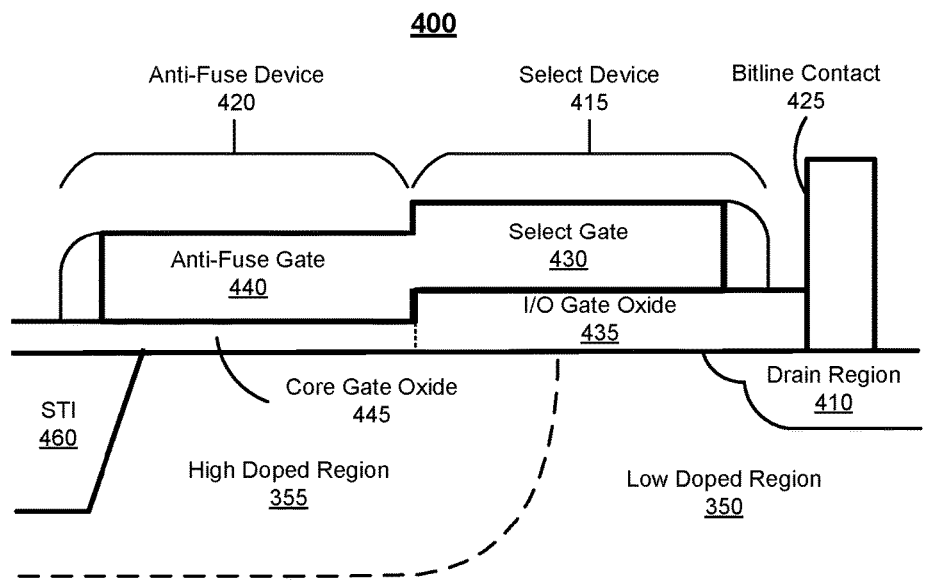
FIG. 4 is a cross sectional diagram an OTP bitcell taken along line B-B' of FIG. 3, according to one embodiment.

The memory device 300 has a low doped region 350, a high doped region 355, and an inter-cell region 360. The components of each bitcell are embedded into or placed on top of the low doped region 350 and/or high doped region 355. The components of the memory device 300 in FIG. 3 are similar to the components of the memory device 100 in FIG. 1, but the select device 315 and anti-fuse device 320 are merged. Also, as shown in FIG. 4, the memory device 300 does not have source regions embedded in the diffusion regions, such as diffusion region 310. Merging the select device 315 and anti-fuse device 320 and removing the source region allows the bitcells of the memory device 300, such as bitcell 1 305 and bitcell 2 340, to be smaller than the bitcells of the memory device 100 shown in FIG. 1.

The bitcells shown in FIG. 3 can be connected in a similar manner to the bitcells shown in FIG. 1. In particular, sets of bitcells are connected together in one direction via the select device 315 and anti-fuse device 320, which span across multiple bitcells and are controlled by a single voltage supplied by the device contact 330. Bitcells are also connected together in a perpendicular direction via bitlines; for example, the bitline contacts of bitcell 1 305 and bitcell 2 340 may be connected to the same bitline, which applies the same voltage to the drain region of both bitcells 305 and 340. As with the embodiment shown in FIG. 1, applying an inhibit voltage to the drain of a bitcell while the select device and anti-fuse device of the bitcell are grounded leads to high GIDL.

FIG. 4 is a cross sectional diagram an OTP bitcell 400 taken along line B-B' of FIG. 3, according to one embodiment. The OTP bitcell 400 corresponds to the bitcell 2 340 in FIG. 3. The bitcell 400 shows many of the same components as bitcell 1 305 in FIG. 3, including the merged anti-fuse gate and select gate, and is formed on partially on top of the low doped region 350 and partially on top of the high doped region 355. The bitcell 400 includes a drain region 410, a select device 415, an anti-fuse device 420, a bitline contact 425, and an STI 460. As noted above, the bitcell 400 does not include a source region. In addition, the select device 415 and anti-fuse device 420 and merged into a single electrically connected device that has a select device component and an anti-fuse device component.

The select device 415 includes a select gate 430 and an I/O gate oxide 435 underneath the select gate 430. The anti-fuse device 420 includes an anti-fuse gate 440 and a core gate oxide 445 underneath the anti-fuse gate 440. The select gate 430 and anti-fuse gate 440 merged so that they are controlled by a single voltage; the select gate 430 and anti-fuse gate 440 may be considered a single gate. In some embodiments, the I/O gate oxide 435 is about twice as thick as the core gate oxide 445. A channel region can form between the anti-fuse gate 440 and the drain region 410. During operation, a channel region is formed between the anti-fuse gate 440 and the drain region 410 through the portions of the high doped region 355 and low doped region 350 below the core and I/O gate oxides 430 and 435.

The anti-fuse device 420 and select device 415 are used to program the bitcell 400. During programming of the bitcell 400, a device contact, similar to the device contact 330 shown in FIG. 3, applies a high voltage, referred to as a rupture voltage, to the select gate 430 and anti-fuse gate 440, while the drain region 410 is grounded. This high voltage difference between the anti-fuse gate 440 and the drain region 410 ruptures a portion of the core gate oxide 445, creating a short or an "anti-fuse" (not shown in FIG. 4) that allows current to flow though the core gate oxide 445 during reading of the bitcell 400. In general, the rupture will form in the core gate oxide 445 because it is thinner than the I/O gate oxide 435, but in some devices (e.g., if there is a defect or irregularity in the I/O gate oxide 435), the rupture may form in the I/O gate oxide 435 rather than the core gate oxide 445. The rupture voltage used to create the anti-fuse is significantly higher than a power supply voltage ("VDD_IO") for the select device, e.g., at least three times the power supply voltage of the select device. For example, in a 1.2V/2.5V process, the rupture voltage may be at least 7.5V, or three times 2.5V.

As shown in FIG. 4, the anti-fuse device 420 and a portion of the select device 415 are positioned above the high doped region 355. The low doped region 350 extends under the drain region 410, bitline contact 425, and a portion of the select device 415. The doping concentration may be graduated near the boundary between the low doped region 350 and the high doped region 355; there may be some fading between the two regions 350 and 355.

The lower doping concentration in the low doped region 350 around the drain region 410 reduces the doping concentration at the p-n junction between these two regions 350 and 410 when the bitcell 200 is in an off state, with the select gate and anti-fuse gates 230 and 240 grounded and an inhibit voltage applied to the bitline contact 225. The low doping concentration in the low doped region 350 reduces the amount of GIDL at the bitcell 400 when another bitcell (that is not connected to the bitcell 400) is being programmed, and a bitcell connected to the same bitline as bitcell 400 (e.g., bitcell 305 in FIG. 3) is being inhibited.

Extending the Source/Drain Region Underneath the Anti-Fuse Device

FIG. 5 is a cross sectional diagram of an anti-fuse device 500 with two potential anti-fuse locations, according to one embodiment. The anti-fuse device 500 includes an anti-fuse gate 502, gate oxide 504, p-well region 506, N+ region 508, and STI 510. The anti-fuse gate 502 is a conductive gate controlled by an anti-fuse contact, as described with respect to FIGS. 1 and 2. The gate oxide 504 is a thin gate oxide in which an anti-fuse can be formed by applying a high voltage to the anti-fuse gate 502 and a low voltage (or ground) to the N+ region 508. The N+ region 508 is an n-doped example of a source region, such as source region 205 of FIG. 2. The N+ region 508 may be a lightly doped drain (LDD) implant that normally is used for a thin gate device. The p-well region 506 is an example of a high doped region, such as high doped region 155. STI 510 is a shallow trench isolation region for preventing current leakage.

A rupture can be formed at any point between the anti-fuse gate 502 and the p-well region 506 or N+ region 508. Two potential anti-fuse locations are shown for the anti-fuse device 500. The potential anti-fuse location 1 512 connects the anti-fuse gate 502 to the p-well region 506. The potential anti-fuse location 2 514 connects the anti-fuse gate 502 to the N+ region 508. When a high voltage is applied to the anti-fuse gate 502, an anti-fuse at anti-fuse location 1 512 or anti-fuse location 2 514 could be formed. If the anti-fuse is formed between the anti-fuse gate 502 to the p-well region 506 (e.g., at potential anti-fuse location 1 512), a high resistance path is created. In order to read the programmed bitcell, the voltage applied has to be high enough to form an N-type inversion region between the anti-fuse and the N+ region 508. On the other hand, if the anti-fuse is formed directly between the anti-fuse gate 502 and the N+ region 508 (e.g., at potential anti-fuse location 2 514), a low resistance path is formed, and a lower voltage can be used to read the bitcell. It is desirable for the anti-fuse to be formed at the same location in each bitcell, and in particular, for the anti-fuse to be formed at the potential anti-fuse location 2 in each bitcell.

FIG. 6 is a cross sectional diagram of an anti-fuse device 600 in the N+ region 608 extends further into the anti-fuse device 600, according to one embodiment. The anti-fuse device 600 includes an anti-fuse gate 602, gate oxide 604, p-well region 606, N+ region 608, and STI 610. The N+ region 608 is wider than the N+ region 508 shown in FIG. 5. The N+ region 508 has been replaced with an LDD that resembles one normally used in an IO/bridge device; the LDD region is typically larger and more graded in higher voltage devices. The N+ region 608 extends to STI 610, so that the gate oxide 604 is formed entirely over the STI 610 or the N+ region 608. In other embodiments, such as the embodiment shown in FIG. 2, the anti-fuse device 220 is narrower and does not extend over the STI. The embodiment shown in FIG. 2 has two source regions (e.g., n+ regions), one on either side of the anti-fuse device 220, which connect underneath the anti-fuse device 220. In the embodiments shown in FIG. 6 and in FIG. 2, the anti-fuse connects the anti-fuse gate directly to the source region 205 or N+ region 608. Thus, the anti-fuse always forms a low resistance path, and a lower voltage can be used to read the bitcell than if the anti-fuse were formed in the memory device 500 of FIG. 5 at potential anti-fuse location 1 512.

Example Table of Operations

FIG. 7 shows two tables of operation voltages of an OTP memory device according to an embodiment. The first table of operation 700 provides identifiers of voltage levels at different points in a memory device (given along the top of the table) and for different operations (given along the left side of the table). The second table of operation 750 provides specific voltages for an exemplary 1.2V/2.5V process.

In the example of FIG. 7, the bitlines (BL) are arranged as columns, and the select gates and wordlines (WL) are arranged as rows. Each read and program operation has at least two bias conditions, one for the row being read or programmed (selected) and one for the other rows (unselected). $V_{inhibit}$ is the intermediate voltage used to prevent rupturing of bitcells connected to the anti-fuse device of the bitcell being programmed. $V_{rupture}$ is the high voltage used to rupture the gate oxide when a bitcell is being programmed. $V_{DD}$ refers to the power supply voltage for the core logic device (i.e., the anti-fuse device), such as 1.2V in a 1.2V/2.5V process. $V_{DD\_IO}$ refers to the power supply voltage for the IO logic device (i.e., the select device), such as 2.5V in a 1.2V/2.5V process. $V_{T,N}$ refers to the threshold voltage for the select device, such as 0.5V.

Overview of Electronic Design Automation Design Flow

Figure 8:
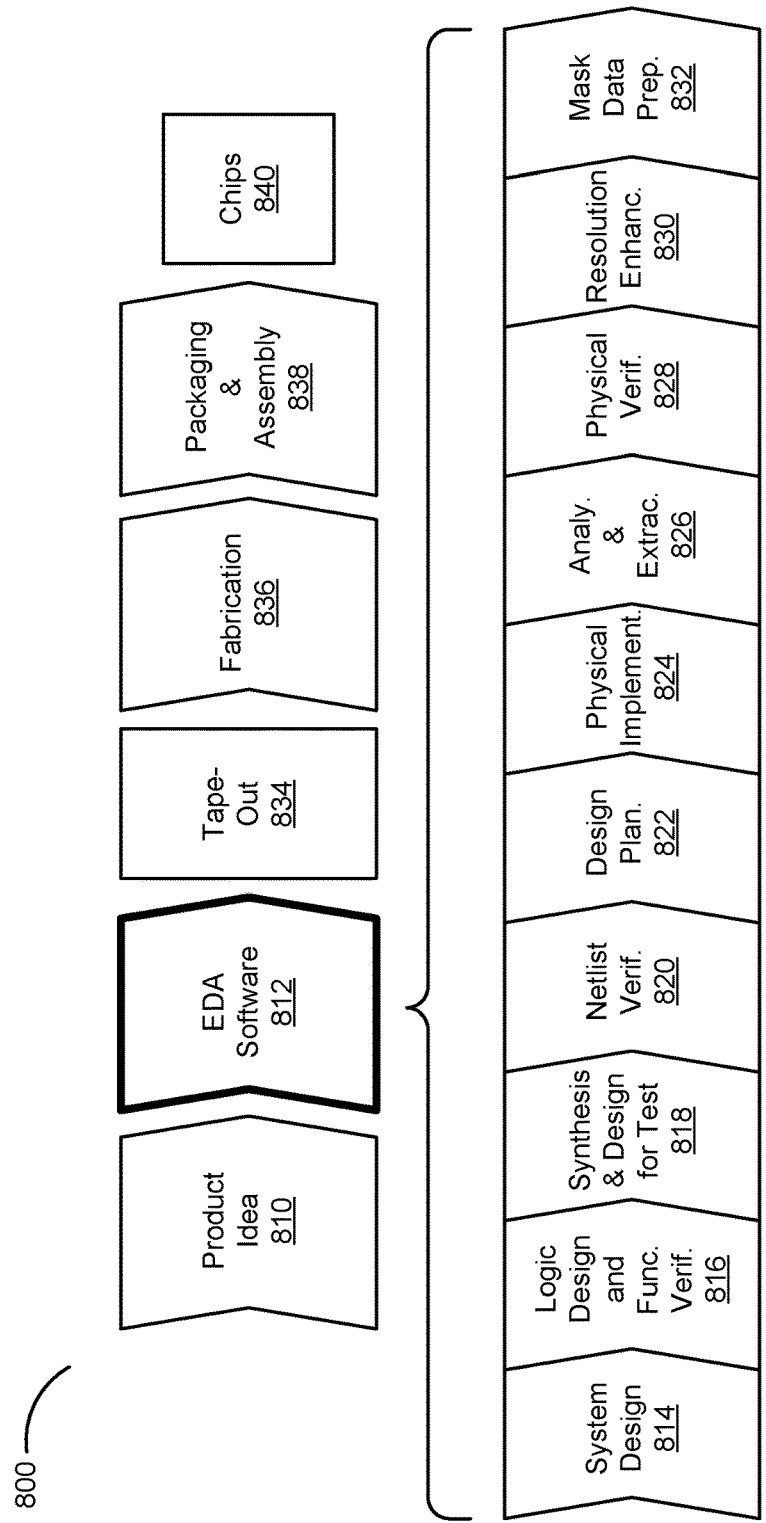
FIG. 8 is a flowchart illustrating the various operations in the design and fabrication of an integrated circuit, according to one embodiment.

FIG. 8 is a flowchart 800 illustrating the various operations in the design and fabrication of an integrated circuit. This process starts with the generation of a product idea 810, which is realized during a design process that uses electronic design automation (EDA) software 812. When the design is finalized, it can be taped-out 834. After tape-out, a semiconductor die is fabricated 836 to form the various objects (e.g., a bitcell including gates, metal layers, vias) in the integrated circuit design. Packaging and assembly processes 838 are performed, which result in finished chips 840.

The EDA software 812 may be implemented in one or more computing devices including a memory. An example of a memory is a non-transitory computer readable storage medium. For example, the EDA software 812 is stored as instructions in the computer-readable storage medium which are executed by a processor for performing operations 814-832 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above with reference to FIGS. 1A through 6 may be stored in the memory. The cell library may be referenced by the EDA software 812 to create a circuit or electronic device incorporating the NVM bitcells or circuits.

During system design 814, designers describe the functionality to implement. They can also perform what-if planning to refine the functionality and to check costs. Note that hardware-software architecture partitioning can occur at this stage. During logic design and functional verification 816, VHDL or Verilog code for modules in the circuit is written and the design is checked for functional accuracy. More specifically, the design is checked to ensure that it produces the correct outputs. During synthesis and design for test 818, VHDL/Verilog is translated to a netlist. This netlist can be optimized for the target technology. Additionally, tests can be designed and implemented to check the finished chips. During netlist verification 820, the netlist is checked for compliance with timing constraints and for correspondence with the VHDL/Verilog source code.

During design planning 822, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 824, the placement (positioning of circuit elements) and routing (connection of the same) occurs. During analysis and extraction 826, the circuit function is verified at a transistor level, which permits refinement. During physical verification 828, the design is checked to ensure correctness for: manufacturing, electrical issues, lithographic issues, and circuitry. During resolution enhancement 830, geometric manipulations of the layout are performed to improve manufacturability of the design. During mask-data preparation 832, the 'tape-out' data for production of masks to produce finished chips is provided.

Embodiments of the present disclosure can be used during one or more of the above-described stages. Specifically, in some embodiments the present disclosure can be used in EDA software 812 that includes operations between design planning 822 and physical implementation 824.

Figure 9:
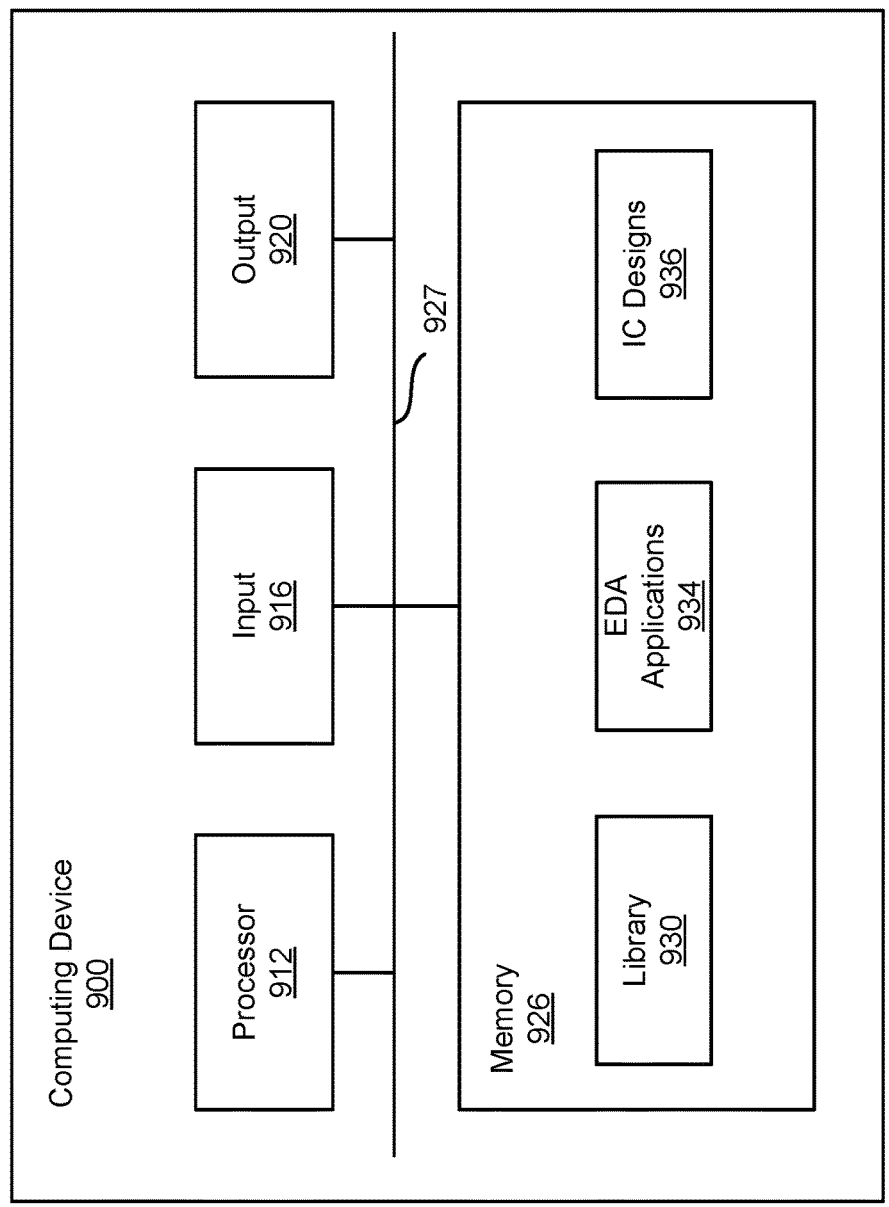
FIG. 9 is a block diagram of a computing device for designing a circuit, according to one embodiment.

FIG. 9 is a block diagram of a computing device 900 for performing designing operations associated with OTP memory devices. The computer device 900 may include, among other components, a processor 912, an input module 916, an output module 920, a memory 926 and a bus 927 for connecting these components. The processor 912 executes instructions stored in the memory 926. The input module 916 may include various devices for receiving user input, including keyboards and pointing devices (e.g., mouse and touch screen). The output module 920 includes a display device or interface device for communicating with the display device.

The memory 926 is a non-transitory computer readable storage medium storing, among others, library 930, electronic design automation (EDA) applications 934 and integrated circuit (IC) designs 936. The library 930 may include data on various circuit components, including instances of OTP memory device describe herein. The EDA applications 934 may include various software programs for designing ICs, including place and route tools, synthesis tools, and verification tools. The design processed by the EDA applications 934 may be stored in IC designs 936. The IC designs 936 may be an entire operational circuit or a part of a larger IC circuit.

Although the above embodiments were described primarily with reference to NMOS processes with n-doped sources, n-doped drains, p-doped wells and p-doped low doped regions, the polarity of the substrate and the devices can be reversed. That is, the embodiments described herein are equally applicable to PMOS devices as well as NMOS devices.

The bitcell has wide applicability. For example, the bitcell may be used as an alternative to expensive flash memory. Flash memory is expensive because it requires a number of additional process steps to create that are not part of the standard CMOS logic process and it adds a significant amount of heat. In contrast, the bitcell can be constructed using the existing CMOS logic process no additional process steps.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A one-time programmable memory device comprising:
    a first doped region of a first polarity and a first doping concentration in a semiconductor substrate;
    a second doped region of the first polarity in the semiconductor substrate, the second region having a second doping concentration that is higher than the first doping concentration;
    a drain region of a second polarity that is opposite the first polarity in the semiconductor substrate, the drain region positioned over the first doped region;
    a source region of the second polarity in the semiconductor substrate, the source region positioned over the second doped region;
    a select device above the semiconductor substrate, the select device configured to form a channel in a channel region of the semiconductor substrate between the source region and the drain region, a first portion of the select device positioned over the first doped region and a second portion of the select device positioned over the second doped region; and
    an anti-fuse device positioned above the second doped region and positioned at least in part above a portion of the source region.

2. The one-time programmable memory device of claim 1, wherein the first doping concentration is a native doping concentration.

3. The one-time programmable memory device of claim 1, wherein the second doping concentration is in a range of twice the first doping concentration to a hundred times the first doping concentration.

4. The one-time programmable memory device of claim 1, wherein:
    the select device comprises a first gate oxide of a first thickness, and a conductive select gate above the first gate oxide; and
    the anti-fuse device comprises a second gate oxide of a second thickness thinner than the first thickness, and a conductive anti-fuse gate above the second gate oxide.

5. The one-time programmable memory device of claim 4, wherein a rupture voltage applied to the anti-fuse gate for forming a short in the second gate oxide is in a range of three times a power supply voltage for the select device to 3.48 times the power supply voltage for the select device.

6. The one-time programmable memory device of claim 5, wherein the second gate oxide is ruptured by applying the rupture voltage to the anti-fuse gate and grounding the drain region.

7. The one-time programmable memory device of claim 5, wherein the power supply voltage for the select device is lower than an inhibit voltage applied to the drain region to inhibit rupturing of the second gate oxide.

8. The one-time programmable memory device of claim 4, wherein a power supply voltage for the anti-fuse gate is 0.4 times to 0.48 times of a power supply voltage for the select gate.

9. The one-time programmable memory device of claim 4, wherein the first thickness of the first gate oxide is twice the second thickness of the second gate oxide.

10. The one-time programmable memory device of claim 1, further comprising a bitline in contact with the drain region, wherein:
    the bitline is in contact with another drain region of a first additional one-time programmable memory device; and
    the bitline applies a first voltage to the drain region and applies the first voltage to the another drain region of the first additional one-time programmable memory device.

11. The one-time programmable memory device of claim 10, wherein:
    the select device and the anti-fuse device are respectively connected to another select device and another anti-fuse device of a second additional one-time programmable memory device, the second additional one-time programmable memory device different from the first additional one-time programmable memory device;
    a second voltage applied to the select device is applied to the another select device of the second additional one-time programmable memory device; and
    a third voltage applied to the anti-fuse device is applied to the another anti-fuse device of the second additional one-time programmable memory device.

12. A non-transitory computer-readable storage medium storing digital representation of a one-time programmable memory device the one-time programmable memory device comprising:
    a first doped region of a first polarity and a first doping concentration in a semiconductor substrate;

a second doped region of the first polarity in the semiconductor substrate, the second region having a second doping concentration that is higher than the first doping concentration;

a drain region of a second polarity that is opposite the first polarity in the semiconductor substrate, the drain region positioned over the first doped region;

a source region of the second polarity in the semiconductor substrate, the source region positioned over the second doped region;

a select device above the semiconductor substrate, the select device configured to form a channel in a channel region of the semiconductor substrate between the source region and the drain region, a first portion of the select device positioned over the first doped region and a second portion of the select device positioned over the second doped region;

an anti-fuse device positioned above the second doped region and positioned at least in part above a portion of the source region.

* * * * *